United States Patent
Quli et al.

(10) Patent No.: US 11,688,614 B2
(45) Date of Patent: Jun. 27, 2023

(54) MITIGATING THERMAL EXPANSION MISMATCH IN TEMPERATURE PROBE CONSTRUCTION APPARATUS AND METHOD

(71) Applicant: KLA Corporation, Milpitas, CA (US)

(72) Inventors: Farhat A. Quli, Castro Valley, CA (US); Razieh Mahzoon, Hawyard, CA (US); Ran Liu, Fremont, CA (US)

(73) Assignee: KLA Corporation, Milpitas, CA (US)

( * ) Notice: Subject to any disclaimer, the term of this patent is extended or adjusted under 35 U.S.C. 154(b) by 227 days.

(21) Appl. No.: 17/243,203

(22) Filed: Apr. 28, 2021

(65) Prior Publication Data

US 2022/0351989 A1 Nov. 3, 2022

(51) Int. Cl.
*H01L 21/67* (2006.01)
*H01L 21/66* (2006.01)

(52) U.S. Cl.
CPC .. *H01L 21/67103* (2013.01); *H01L 21/67248* (2013.01); *H01L 22/12* (2013.01)

(58) Field of Classification Search
CPC .................................................. H01L 21/67103
See application file for complete search history.

(56) References Cited

U.S. PATENT DOCUMENTS

| | | | |
|---|---|---|---|
| 8,033,190 B2 | 10/2011 | Renken et al. | |
| 8,604,361 B2 | 12/2013 | Sun et al. | |
| 9,029,180 B2 | 5/2015 | Britton et al. | |
| 9,719,867 B2 | 8/2017 | Sharratt et al. | |
| 9,823,121 B2 | 11/2017 | Sun et al. | |
| 10,460,966 B2 | 10/2019 | Sun et al. | |
| 2005/0214956 A1 | 9/2005 | Li et al. | |
| 2011/0040527 A1 | 2/2011 | Renken | |
| 2016/0370797 A1 | 12/2016 | Azarya et al. | |
| 2017/0219437 A1* | 8/2017 | Sun | ............................ G01T 7/00 |
| 2017/0365495 A1* | 12/2017 | Sun | .................... H01L 21/68764 |
| 2018/0313697 A1 | 11/2018 | Montes et al. | |
| 2019/0368944 A1 | 12/2019 | Jensen | |

FOREIGN PATENT DOCUMENTS

WO     2011075386 A3     11/2011

OTHER PUBLICATIONS

International Search Report and Written Opinion in International Application No. PCT/US2022/026241 dated Aug. 12, 2022, 8 pages.

* cited by examiner

*Primary Examiner* — Sherman Ng
(74) *Attorney, Agent, or Firm* — Suiter Swantz pc llo

(57) ABSTRACT

A process condition sensing apparatus is disclosed. The apparatus includes a substrate and an electronic enclosure including one or more electronic components. The apparatus includes a floating connection assembly configured to mechanically couple the electronic enclosure to the substrate, the floating connection assembly includes a leg and a foot. The leg or foot are arranged to mitigate thermal stress between one or more interfaces. The one or more interfaces include a leg-enclosure interface or a foot-substrate interface.

20 Claims, 6 Drawing Sheets

MITIGATING THERMAL EXPANSION MISMATCH IN TEMPERATURE PROBE CONSTRUCTION APPARATUS AND METHOD

TECHNICAL FIELD

The present invention generally relates to process condition substrate devices, and, more particularly, to an instrumented substrate configured to mitigate thermal expansion between components of the instrumented substrate.

BACKGROUND

As the demand for improved process monitoring systems continues to increase, the tolerances on process conditions in semiconductor device processing environments continue to decrease. Thermal uniformity within a processing system is one such condition. In a device that is intended to measure temperature, the electronics and batteries can be insulated by a thermal mass such that they never reach above a certain temperature. If either the electronics or battery are exposed to a temperature that exceeds a certain temperature some electronics and/or the battery may become permanently damaged and non-functional, while other electronics may continue to function above this temperature. Further, if a device is secured mechanically to a substrate, the materials used within the device may expand at different rates due to temperature differences and/or different thermo-mechanical properties. The expansion rates may cause undue stress at certain points of connection between the device and substrate, further causing damage and leading to non-functional devices if unmitigated.

It would be desirable to provide an apparatus and method that cure the shortfalls of the previous approaches identified above.

SUMMARY

A process condition sensing apparatus is disclosed, in accordance with one or more embodiment of the present disclosure. In embodiments, the apparatus includes a substrate. In embodiments, the apparatus includes an electronic enclosure including one or more electronic components. In embodiments, the apparatus includes a floating connection assembly configured to mechanically couple the electronic enclosure to the substrate. The floating connection assembly may include a leg and a foot, at least one of the leg or foot are arranged to mitigate thermal stress between one or more interfaces, the one or more interfaces comprise at least one of a leg-enclosure interface or a foot-substrate interface.

A method is disclosed, in accordance with one or more embodiments of the present disclosure. In embodiments, the method includes providing a substrate. In embodiments, the method includes securing an electronic enclosure to the substrate via a floating connection assembly, the floating connection assembly configured to mechanically couple the electronic enclosure to the substrate, the floating connection assembly including a leg and a foot, the leg and foot are arranged to mitigate thermal stress between a leg-enclosure interface and a foot-substrate interface. In embodiments, the method includes securing the electronic enclosure to the leg, the leg comprising a securing section, a top cap, and a bottom cap, the securing section passing through a portion of the electronic enclosure and the top cap and bottom cap securing the electronic enclosure to the securing section, the securing section is sized to provide a gap between the securing section and an internal channel wall of the electronic enclosure, the gap mitigating thermal stress at the leg-enclosure interface. In embodiments, the method includes securing the foot to the substrate, the floating connection assembly including a retainer, the retainer is arranged to overlap the foot in a direction along the surface of the substrate, the retainer is arranged to provide a gap between the foot and the retainer in a direction perpendicular to the surface of the substrate, the gap mitigating thermal stress at the foot-substrate interface.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures.

DETAILED DESCRIPTION

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure. Reference will now be made in detail to the subject matter disclosed, which is illustrated in the accompanying drawings.

Referring generally to FIGS. 1-6, a process condition sensing device and method is described, in accordance with one or more embodiments of the present disclosure.

Embodiments of the present disclosure are directed to a process condition sensing device. For example, the process condition sensing device may include an electronic enclosure, which rests on legs and feet to mechanically couple to a substrate. Due to temperature gradients and thermal expansion mismatches, the legs, feet, substrate and electronic enclosure expand at different rates, in the plane of the substrate and out of plane of the substrate (i.e., vertical or perpendicular to the substrate), which may result in warpage and/or mechanical failure if unmitigated. The mechanical coupling at certain stress points (e.g., the leg and the electronic enclosure and/or the foot and the substrate) may fail or become unsuitable at higher temperatures. As such, it would be desirable to provide a device and method that mitigates the thermal stresses at these points.

Process condition sensing devices may incorporate an instrumented substrate to measure processing conditions within a processing chamber. These devices provide the most accurate measure of the conditions of the chamber because the thermal properties (e.g., thermal conductivity) of the substrate are the same as, or similar to, actual semiconductor devices that will be processed. Probe devices are generally described in U.S. Pat. No. 8,033,190, issued on Oct. 11, 2011 to Renken et al.; U.S. Pat. No. 8,604,361, issued on Dec. 10, 2013 to Sun et al.; U.S. Pat. No. 9,719,867, issued on Aug. 1, 2017 to Sharratt et al.; U.S. Pat. No. 9,823,121, issued on Nov. 21, 2017 to Sun et al.; U.S. Pat. No. 10,460,966, issued on Oct. 29, 2019 to Sun et al.; U.S. Patent Publication No. 2017/0219437, published on Aug. 3, 2017; and U.S. Patent Publication No. 2019/0368944, published on Dec. 5, 2019, which are each incorporated herein by reference in their entirety.

Figure 2:
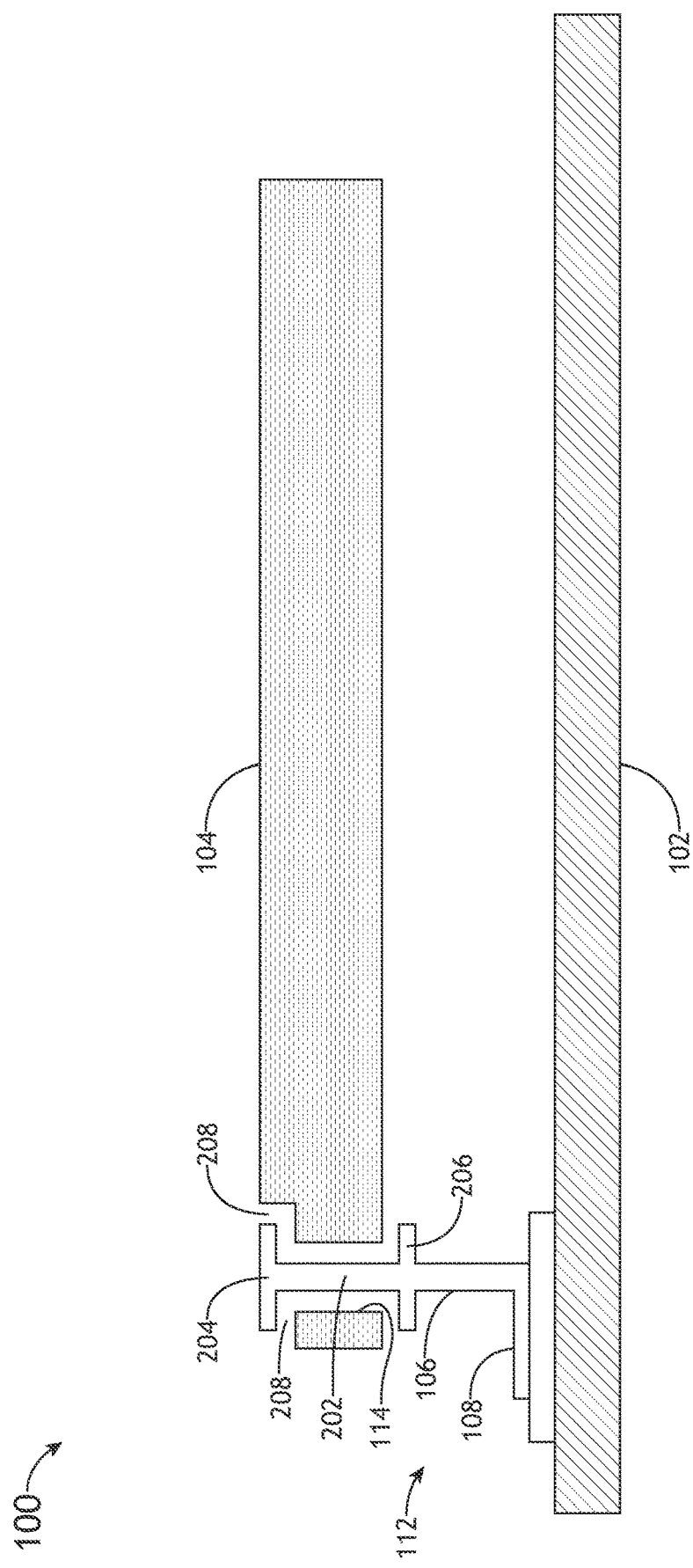
FIG. 2 illustrates a simplified cross-sectional view of a process condition sensing apparatus, in accordance with one or more embodiments of the present disclosure.
Figure 3:
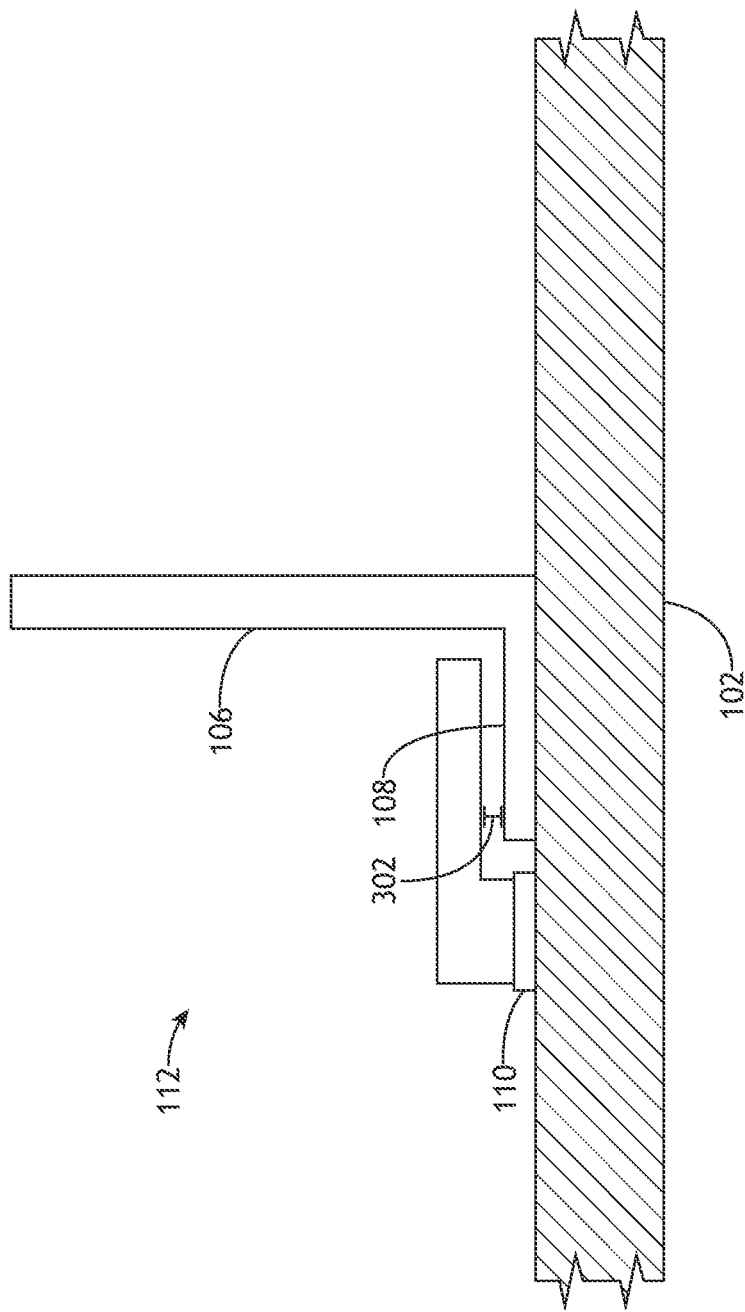
FIG. 3 illustrates a simplified cross-sectional view of a process condition sensing apparatus, in accordance with one or more embodiments of the present disclosure.

FIGS. 2-3 illustrate a simplified cross-sectional view of the process condition sensing device 100, in accordance with one or more embodiments of the present disclosure. In embodiments, the device 100 includes a substrate 102, an electronic enclosure 104, and a floating connection assembly 112.

The substrate 102 may include any substrate known in the art of semiconductor processing. In embodiments, the substrate 102 is a wafer. For example, the substrate 102 may include, but is not limited to, a semiconductor wafer (e.g., silicon wafer). The substrate 102 may be formed of any material known in the art including, but not limited to, silicon, glass, ceramic, gallium arsenide, carbide, nitride, quartz, or the like. It is noted herein that the substrate 102 may take on the same, or similar, size and shape as a standard substrate processed by a semiconductor device processing system. Further, it is noted that although FIG. 2-3 illustrate the substrate 102 without one or more layers, the device 100 may include a layered substrate (e.g., a substrate with at least a top layer and a bottom layer).

In embodiments, the substrate 102 is used to measure the processing conditions of semiconductor fabrication equipment. For example, the substrate 102 may be used to measure process conditions that a sample (e.g., a wafer) undergoes during processing. In embodiments, one or more sensors are disposed on the substrate 102 at one or more locations across the substrate 102. In embodiments, the one or more sensors are configured to acquire one or more measurement parameters at the one or more locations across the substrate 102. In embodiments, the one or more sensors may be coupled to one or more components (e.g., one or more processors, memory, communication circuitry) within the electronic enclosure 104 and configured to transmit measurement data to the components of the electronic enclosure 104. It is noted herein that the substrate 102 may include any configuration of sensors (e.g., number, location, etc.).

It is noted that the one or more sensors may include any measurement device known in the art including, but not limited to, one or more temperature sensors, one or more pressure sensors, one or more radiation sensors, one or more chemical sensors, or a combination thereof. For example, the one or more sensors may include one or more temperature sensors configured to acquire one or more parameters indicative of temperature. For instance, the one or more temperature sensors may include, but are not limited to, one or more thermocouple (TC) devices (e.g., thermoelectric junction), one or more resistance temperature devices (RTDs) (e.g., thin film RTD), or the like. In another instance, in the case of pressure measurements, the one or more sensors may include, but are not limited to, a piezoelectric sensor, a capacitive sensor, an optical sensor, a potentiometric sensor or the like. In another instance, in the case of radiation measurements, the one or more sensors may include, but are not limited to, one or more light detectors (e.g., photovoltaic cell, photoresistor and the like) or other radiation detectors (e.g., solid state detector). In another instance, in the case of chemical measurements, the one or more sensors may include, but are not limited to, one or more chemiresistors, gas sensors, pH sensors, or the like.

In embodiments, the electronic enclosure 104 is mechanically coupled to the substrate 102. For example, the electronic enclosure 104 may be coupled to the substrate 102 via a floating connection assembly 112. The floating connection assembly 112 may be configured to support the electronic enclosure 104 on the substrate 102. For example, the floating connection assembly 112 may include, but is not limited to, one or more legs 106 (e.g., single support leg or multiple support legs), one or more feet 108 (e.g., single support foot for a leg 106 or multiple support feet for multiple legs 106), and a retainer 110.

In embodiments, a particular leg 106 further includes a securing section 202, a top cap 204, and a bottom cap 206. For example, as shown in FIG. 2, the securing section 202 of leg 106 may mechanically couple to the electronic enclosure 104 via an internal channel 114. The internal channel 114 may be configured to enclose, or substantially enclose, the securing section 202 of the leg 106. For example, the internal channel 114 may be dimensioned to surround the securing section 202 such that a gap 208 exists between the securing section 202 and an inner wall of the internal channel 114, thereby creating a leg-enclosure interface 101. For instance, the leg 106 may be 1 to 2 millimeters tall. By way of another instance, the gap 208 at the leg-enclosure interface may be 0.01 to 1.5 millimeters. By way of another example, the leg 106 may secure the electronic enclosure 104 via the top cap 204 atop the electronic enclosure 104 and a bottom cap 206 underneath the electronic enclosure 104. For instance, the top cap 204 and the bottom cap 206 may be dimensioned to secure the electronic enclosure 104 such that a gap 208 exists between the top cap 204 and the electronic enclosure 104, along with a gap 208 between the bottom cap 206 and the electronic enclosure 104. In addition, the gap 208 at the top cap 204 and bottom cap 206 may be 0.01 to 1.5 millimeters. The top cap 204 and bottom cap 206 may be coupled to the one or more legs 106 via any manner known in the art including, but not limited to, welding, or the like. In this manner, the gap 208 at the leg-enclosure interface 101 (e.g., leg-internal channel and top cap-electronic enclosure-bottom cap) mitigates thermal stresses by allowing room for expansion of the one or more legs 106 along a direction perpendicular to the substrate and/or a direction parallel to the substrate.

In embodiments, the electronic enclosure 104 is coupled to the substrate 102 via a foot 108, thereby creating a foot-substrate interface 103. The foot 108 may be further secured on the substrate 102 via a retainer 110. For example, the retainer 110 may be positioned above, and overlap the foot 108. As illustrated in FIG. 3, the retainer 110 may additionally include a gap 302 above the foot 108. For example, the gap 302 may surround, or substantially surround, foot 108. For instance, the gap 302 may be 0.01 to 1.5 millimeters in size. The gap 302 at the foot-substrate interface 103 mitigates thermal stresses by allowing room for expansion of the one or more feet 108 along a direction perpendicular to the substrate and/or a direction parallel to the substrate.

In embodiments, the floating connection assembly 112 is formed from a material having a low thermal conductivity coefficient so as to limit the heat transfer between the electronic enclosure 104 and the substrate 102. For example, the floating connection assembly 112 may be formed from a low thermal conductivity material such as, but not limited to, a ceramic, a composite, a crystalline material, glass, or the like. For instance, the floating connection assembly 112 may be formed from a low thermal conductivity material such as, but not limited to, silicon nitride, silicon oxide, or the like.

In embodiments, the floating connection assembly 112 (e.g., the one or more feet 108 and/or retainer 110) is coupled to the substrate 102 via an adhesive. It is noted herein, the adhesive may be any adhesive known in the art.

It is noted that the floating connection assembly 112 may include floating connections at the leg-enclosure interface and/or the foot-substrate interface. For example, the floating connection assembly 112 may only include one or more legs 106 with a securing section 202, a top cap 204, a bottom cap 206, and a gap 208 and/or one or more feet 108 with a retainer 110 and a gap 302.

Figure 1:
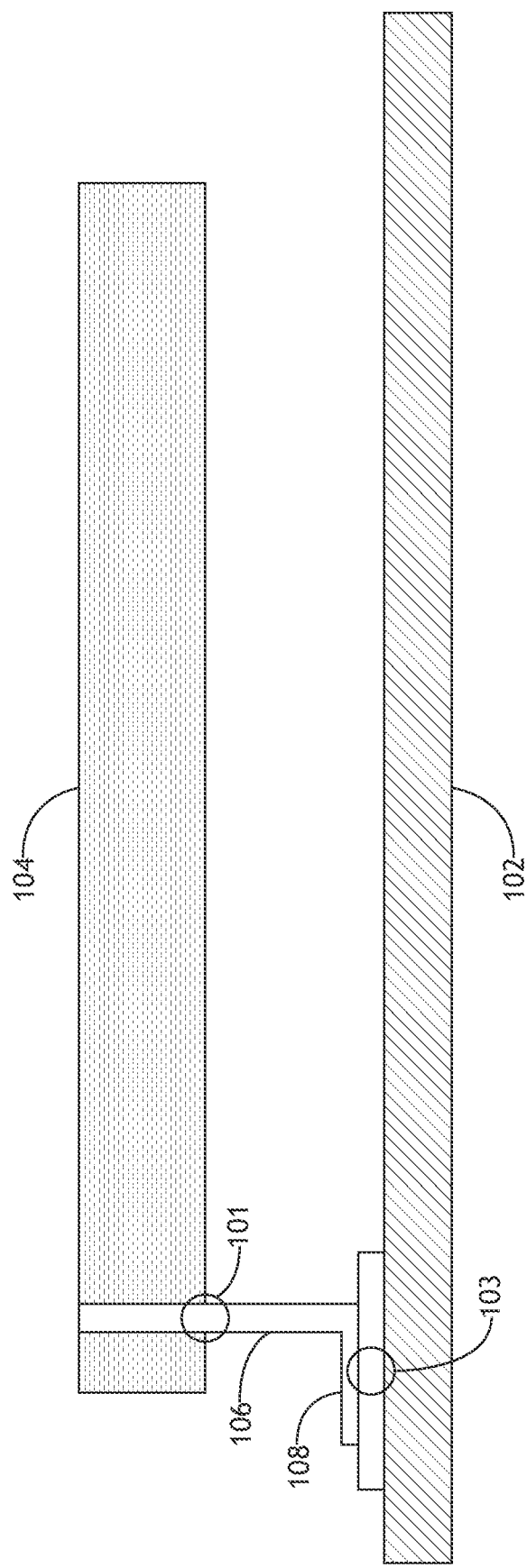
FIG. 1 illustrates a simplified cross-sectional view of a process condition sensing apparatus, in accordance with one or more embodiments of the present disclosure.
Figure 4:
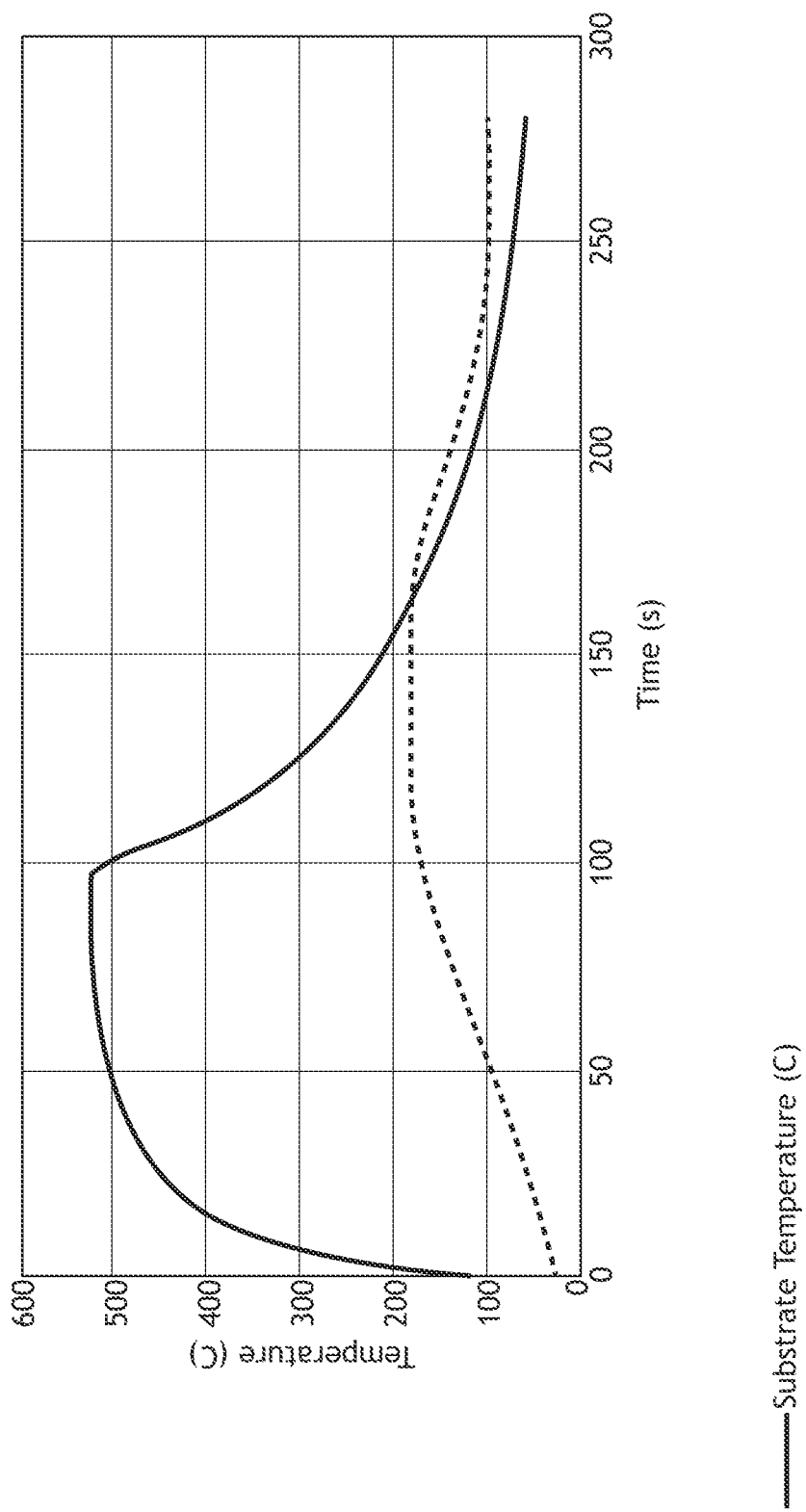
FIG. 4 is a time-temperature graph illustrating data collection of the process condition sensing apparatus, in accordance with one or more embodiments of the present disclosure.

FIG. 4 is a time-temperature plot 400 illustrating data collection of a process condition sensing device 100, in accordance with one or more embodiments of the present disclosure. As shown in FIG. 4, as the substrate 102 rapidly increases in temperature, the device 100 does not raise or lower in temperature as rapidly, thus the thermal expansion of the device 100 is much slower to react than the substrate 102. As such, the device 100 including the floating connection assembly 112 may overcome mechanical coupling stress points at the leg-enclosure interface 101 and the foot-substrate interface 103, in the plane of the substrate and out of plane of the substrate due to unequal heating and/or mismatched thermal expansion, as indicated in FIG. 1.

Figure 5:
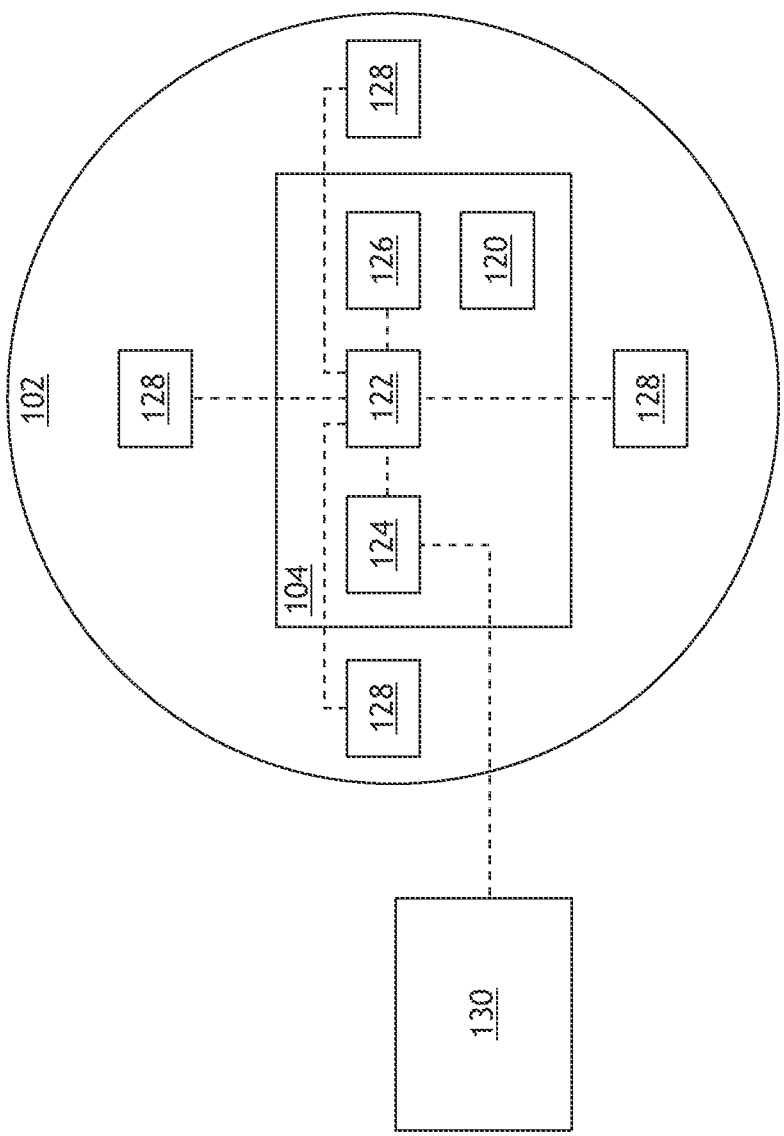
FIG. 5 illustrates a simplified block diagram of one or more electronic components of the electronic enclosure, in accordance with one or more embodiments of the present disclosure.

FIG. 5 illustrates a simplified block diagram of one or more electronic components of the electronic enclosure 104, in accordance with one or more embodiments of the present disclosure. In embodiments, the electronic enclosure 104 includes one or more electronic components. In embodiments, the one or more electronic components of the electronic enclosure 104 include a power source 120. The electronic enclosure 104 may include any type of power source known in the art. For example, the electronic enclosure 104 may include one or more batteries. For instance, the electronic enclosure 104 may include one or more coin cell batteries. In embodiments, the power source 120 may be housed in a housing. For example, the power source 120 may be housed in a metal housing within the electronic enclosure 104. By way of another example, the power source 120 may be housed outside the electronic enclosure 104.

In embodiments, the one or more electronic components of the electronic enclosure 104 include one or more processors 122. For example, the one or more processors 122 may be configured to receive one or more measurement parameters from the one or more sensors of the electronic enclosure 104. In embodiments, the one or more electronic components of the electronic enclosure 104 include communication circuitry 124. In embodiments, the one or more electronic components of the electronic enclosure 104 include a memory medium 126 (e.g., memory) for storing the program instructions for the one or more processors 122 and/or the measurement parameters received from the one or more sensors.

It is noted herein that the one or more electronic components of the electronic enclosure 104 may include any electronic component known in the art including, but not limited to, an analog-to-digital converter.

In embodiments, the electronic enclosure 104 is communicatively coupled to a remote data system 130. In embodiments the electronic enclosure 104 transmits a plurality of measurement parameters to the remote data system 130.

The one or more processors 122 may include any processor or processing element known in the art. For the purposes of the present disclosure, the term "processor" or "processing element" may be broadly defined to encompass any device having one or more processing or logic elements. In this sense, the one or more processors 122 may include any device configured to execute algorithms and/or instructions (e.g., program instructions stored in memory). It should be recognized that the steps described throughout the present disclosure may be carried out by a single processor or, alternatively, multiple processors.

The memory medium 126 may include any storage medium known in the art suitable for storing program instructions executable by the associated one or more processors 122. For example, the memory medium 126 may include a non-transitory memory medium. By way of another example, the memory medium 126 may include, but is not limited to, a read-only memory (ROM), a random-access memory (RAM), a solid-state drive, and the like. It is further noted that memory medium 126 may be housed in a common controller housing with the one or more processors 122. In embodiments, the memory medium 126 is located remotely with respect to the physical location of the one or more processors 122. For instance, the one or more processors 122 may access a remote memory (e.g., server), accessible through a network (e.g., internet, intranet and the like).

In embodiments, one or more components within the electronic enclosure 104 may be communicatively coupled to one or more sensors 128. For example, the components of electronic enclosure 104 may be coupled to the one or more sensors 128 via one or more wired connections (e.g., wires, interconnects, or the like). In embodiments, the one or more electronic components of the electronic enclosure 104 may be configured to acquire one or more measurement parameters from the one or more sensors 128. For instance, the one or more processors 122 of the electronic enclosure 104 may acquire one or more measurement parameters from the one or more sensors. The one or more measurement parameters may include, but are not limited to, voltage (or other signals) from a temperature sensor (e.g., thermocouple), voltage (or other signals) from a pressure sensor, voltage (or other signals) from a radiation sensor, voltage (or other signals) from a chemical sensor, and the like.

Figure 6:
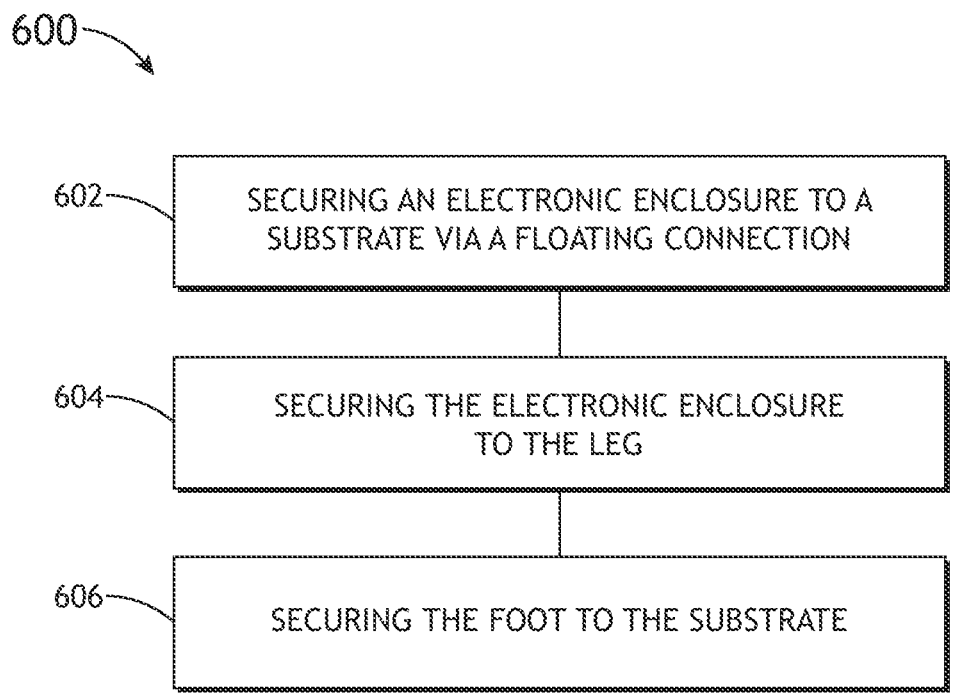
FIG. 6 illustrates a flowchart depicting a method for extending the operating parameters of the process condition sensing apparatus, in accordance with one or more embodiments of the present disclosure.

FIG. 6 illustrates a flowchart of a method 600 for mitigating thermally-induced stresses of process condition sensing device in order to extend the operating parameters of the process condition sensing device, in accordance with one or more embodiments of the present disclosure. It is noted herein that the steps of method 600 may be implemented all or in part by device 100. It is further recognized, however, that the method 600 is not limited to the device 100 in that additional or alternative apparatus-level embodiments may carry out all or part of the steps of method 600.

In a step 602, an electronic enclosure is secured to a substrate via a floating connection. For example, a floating connection (e.g., the floating connection assembly 112) may include one or more legs 106 and one or more feet 108. For instance, the electronic enclosure 104 may be mechanically coupled to the substrate 102 via the one or more legs 106 and one or more feet 108.

In a step 604, the electronic enclosure is secured to the leg. For example, the electronic enclosure 104 may be mechanically coupled to a leg 106 via the securing section 202, the top cap 204, and the bottom cap 206. For instance, the securing section 202 may pass through a portion of the electronic enclosure 104. In addition, the top cap 204 and the bottom cap 206 may secure the electronic enclosure 104 on either side of the securing section 202, as illustrated in FIG. 2. In another instance, the securing section 202 may be dimensioned to provide a gap 208 between the leg 106 and an inner wall of the internal channel 114 of the electronic enclosure 104. It is noted herein, the gap 208 may be able to mitigate thermal stress at the interface 101 between the leg 106 (e.g., securing section 202, top cap 204, and bottom cap 206) and the electronic enclosure 104.

In a step 606, the foot is secured to the substrate. For example, a foot 108 may be secured to the substrate 102 via an adhesive. By way of another example, the foot of the one or more feet 108 may be further secured by a retainer 110. For instance, the retainer 110 may be laterally above, and overlap the one or more feet 108, as illustrated in FIG. 3. In another instance, the retainer 110 may allow for a gap 302 between the retainer 110 and the foot 108. It is noted herein, the gap 302 may be able to mitigate thermal stress at the interface 103 between the foot 108 (e.g., foot 108 and retainer 110) and the substrate 102.

One skilled in the art will recognize that the herein described components, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, devices, and objects should not be taken as limiting.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," "temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A process condition sensing apparatus, comprising:
   a substrate;
   an electronic enclosure, wherein one or more electronic components are disposed within the electronic enclosure; and
   a floating connection assembly configured to mechanically couple the electronic enclosure to the substrate, wherein the floating connection assembly includes a leg and a foot, wherein at least one of the leg or foot are arranged to mitigate thermal stress between one or more interfaces, wherein the one or more interfaces comprises at least one of a leg-enclosure interface or a foot-substrate interface,
   wherein the floating connection assembly includes a retainer, wherein the retainer is arranged to overlap with the foot in a direction along the surface of the substrate and wherein the retainer is arranged to provide a gap between the foot and the retainer in a direction perpendicular to the surface of the substrate, wherein the gap mitigates thermal stress at the foot-substrate interface.

2. The apparatus of claim 1, wherein the leg comprises a securing section, a top cap, and a bottom cap, wherein the securing section passes through a portion of the electronic enclosure and wherein the top cap and bottom cap secure the electronic enclosure to the securing section, wherein the securing section is sized to provide a gap between the securing section and an internal channel wall of the electronic enclosure, wherein the gap mitigates thermal stress at the leg-enclosure interface.

3. The apparatus of claim 2, wherein the top cap and the bottom cap secure the electronic enclosure in a vertical direction along the securing section.

4. The apparatus of claim 2, wherein the leg is machined to form the bottom cap and the securing section in a single piece.

5. The apparatus of claim 4, wherein the top cap is welded to the securing section.

6. The apparatus of claim 2, wherein the top cap and the bottom cap are welded to the securing section.

7. The apparatus of claim 2, wherein the gap is between 0.01 and 1.5 millimeters.

8. The apparatus of claim 2, wherein the foot is secured to the substrate via an adhesive.

9. The apparatus of claim 1, wherein the gap is between 0.01 and 1.5 millimeters.

10. The apparatus of claim 1, wherein the retainer is secured to the substrate via an adhesive.

11. The apparatus of claim 1, wherein the retainer is integrated into the substrate.

12. The apparatus of claim 1, wherein the retainer has a thermal expansion coefficient approximately matching a thermal expansion coefficient of the substrate.

13. The apparatus of claim 1, wherein the one or more electronic components of the electronic enclosure comprise:
    one or more processors, wherein the one or more processors are configured to receive one or more measurement parameters from one or more sensors;
    communication circuitry;
    memory; and
    a power source.

14. A process condition sensing apparatus, comprising:
    a substrate;
    an electronic enclosure, wherein one or more electronic components are disposed within the electronic enclosure; and
    a floating connection assembly configured to mechanically couple the electronic enclosure to the substrate, wherein the floating connection assembly includes a leg and a foot, wherein the leg and foot are arranged to mitigate thermal stress between a leg-enclosure interface and a foot-substrate interface,
    wherein the leg comprises a securing section, a top cap, and a bottom cap, wherein the securing section passes through a portion of the electronic enclosure and wherein the top cap and bottom cap secure the electronic enclosure to the securing section, wherein the securing section is sized to provide a gap between the securing section and an internal channel wall of the electronic enclosure, wherein the gap mitigates thermal stress at the leg-enclosure interface, wherein the floating connection assembly includes a retainer, wherein the retainer is arranged to overlap the foot in a direction along the surface of the substrate and wherein the retainer is arranged to provide a gap between the foot and the retainer in a direction perpendicular to the surface of the substrate, wherein the gap mitigates thermal stress at the foot-substrate interface.

15. The apparatus of claim 14, wherein the foot is secured to the substrate via an adhesive.

16. The apparatus of claim 14, wherein the retainer is secured to the substrate via an adhesive.

17. The apparatus of claim 14, wherein the retainer is integrated into the substrate.

18. The apparatus of claim 14, wherein the retainer has a thermal expansion coefficient approximately matching a thermal expansion coefficient of the substrate.

19. The apparatus of claim 14, wherein the one or more electronic components of the electronic enclosure comprise:
one or more processors, wherein the one or more processors are configured to receive one or more measurement parameters from one or more sensors;
communication circuitry;
memory; and
a power source.

20. A method, comprising:
providing a substrate;
securing an electronic enclosure to the substrate via a floating connection assembly, the floating connection assembly configured to mechanically couple the electronic enclosure to the substrate, wherein the floating connection assembly includes a leg and a foot, wherein the leg and foot are arranged to mitigate thermal stress between a leg-enclosure interface and a foot-substrate interface;
securing the electronic enclosure to the leg, wherein the leg comprises a securing section, a top cap, and a bottom cap, wherein the securing section passes through a portion of the electronic enclosure and wherein the top cap and bottom cap secure the electronic enclosure to the securing section, wherein the securing section is sized to provide a gap between the securing section and an internal channel wall of the electronic enclosure, wherein the gap mitigates thermal stress at the leg-enclosure interface; and
securing the foot to the substrate, wherein the floating connection assembly includes a retainer, wherein the retainer is arranged to overlap the foot in a direction along the surface of the substrate and wherein the retainer is arranged to provide a gap between the foot and the retainer in a direction perpendicular to the surface of the substrate, wherein the gap mitigates thermal stress at the foot-substrate interface.

* * * * *